United States Patent [19]
Walck

[11] Patent Number: 5,959,489
[45] Date of Patent: *Sep. 28, 1999

[54] METHOD AND APPARATUS FOR CONTROLLING SELECTABLE FUNCTIONS OF AN EXTERNAL CIRCUIT

[75] Inventor: Jeffrey Alan Walck, Clinton Township Hunterdon County, N.J.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/782,007

[22] Filed: Jan. 7, 1997

[51] Int. Cl.⁶ .................................................. H03L 5/00
[52] U.S. Cl. ............................................. 327/333; 326/30
[58] Field of Search ........................... 327/108–112, 333; 326/30

[56] References Cited

U.S. PATENT DOCUMENTS

| | | | |
|---|---|---|---|
| 4,748,426 | 5/1988 | Stewart | 326/30 |
| 5,581,201 | 12/1996 | Sonner et al. | 327/333 |
| 5,731,711 | 3/1998 | Gabara | 326/30 |

*Primary Examiner*—Kenneth B. Wells

[57] ABSTRACT

An apparatus and method for providing both switch control and processor control over selectable functions of an external circuit. The present invention provides a control circuit having a single input/output port through which the control circuit reads a present function of the external circuit as controlled by the switch circuit, and generates a control signal to override the switch circuit control when the present function is not the same as a desired function.

27 Claims, 1 Drawing Sheet

tions of an external circuit.

METHOD AND APPARATUS FOR CONTROLLING SELECTABLE FUNCTIONS OF AN EXTERNAL CIRCUIT

FIELD OF THE INVENTION

This invention relates to the field of semiconductor devices and is a method and apparatus for reducing the number of input/output pins needed on an integrated circuit when used in conjunction with a switch circuit to control selectable functions of an external circuit.

BACKGROUND OF THE INVENTION

An increasing need to reduce the number of input/output pins necessary for a programmable logic device (PLD), field programmable gate array (FPGA), ASIC, or other control integrated circuits has been recognized by industry in technical fields relating to digital processors and semiconductor devices. In the semiconductor industry, for example, reducing the number of input/output pins on a semiconductor chip affects physical layout and size of the chip and thus, decreases cost and complexity of the semiconductor chip.

One of the functions of input pins and output pins on an integrated circuit is to control selectable functions of external circuits using binary signals. Selectable functions of external circuits could be anything capable of being turned on or off digitally. Selectable functions include an enable to turn on/off a data buffer, lamp driver, or light emitting diode (LED). Selectable functions could also mean providing a base address for some memory, representing address bits that could be used as a comparator, activating a relay, or opening/closing an actuator.

A traditional technique uses a control chip, e.g., an integrated circuit, in conjunction with a switch circuit to control the selectable functions of an external circuit. FIG. 1 shows an embodiment of a traditional technique. The control chip 10 has a control/data bus 11 that electrically couples the control chip to a controlling processor 12. The control chip has an input pin 13 and an output pin 14. The output pin 14 connects to the control point 15 of an external circuit (not shown). The switch circuit 16 has Vcc connecting to a pull-up resistor, herein depicted as a 10 k ohm resistor, which electrically connects to a switch attached to ground. The input pin of the control chip is connected between the 10 k ohm resistor and the switch.

The controlling processor reads the switch settings through the input pin of the control chip. When the switch setting is open, the input pin is set high or to Vcc. When the switch setting is closed, the input pin is set to a logic zero. The controlling processor can modify the value read from the switch settings using software and output this modified value through the output pin of the control chip to the control point of the external circuit. Alternatively, it can allow the value of the switch setting to flow through the output pin of the control chip to the control point of the external circuit.

Modern computer architecture necessitates that as much circuitry as possible is placed on a semiconductor chip. This goal is often limited by the number of input/output pins on the chip available for routing signals in or out. A large number of input/output pins results in extra complexity. This extra complexity directly translates into a larger budget for the core, more silicon area, and thus more cost. Extra complexity also has an impact on time-to-market. A fundamental problem exists with the traditional technique since two pins, namely an input pin and an output pin are used in conjunction with the switch circuit. It is imperative that the number of input/output pins be reduced on a semiconductor chip to reduce the physical size of the chip and thus reduce cost and complexity. As a result, a need exists to reduce the number of input/output pins on a control chip when used in conjunction with a switch circuit to control selectable functions of an external circuit.

SUMMARY OF THE INVENTION

The present invention is directed to a method and apparatus for controlling selectable functions of an external circuit. To attain this, the present invention provides a system for providing both switch control and processor control over selectable functions of an external circuit which has a switch circuit coupled to a control point of the external circuit for providing switch control. The switch circuit generates a switch signal that is input to the control point of the external circuit. The system also has a control circuit for providing processor control. The control circuit has a single input/output coupled to the switch signal for reading the switch signal and for generating a control signal to override the switch signal to select a function of the external circuit.

The present invention also includes a method for providing processor control over an external circuit under control of a switch circuit wherein the switch circuit generates a switch signal input to the control point of the external circuit comprising the steps of reading the switch signal from the input/output port of a control circuit to determine the present function of the external circuit, determining whether the present function of the external circuit is a desired function; and generating a control signal through the input/output port of the control circuit for overriding the switch signal to select the desired function. Thus, the present invention overcomes, to a large extent, the limitations associated with the prior art.

These and other features of the present invention are described in more detail in the following detailed description of embodiments of the invention when taken with the drawings. The scope of the invention, however, is limited only by the claims appended hereto.

BRIEF DESCRIPTION OF THE DRAWINGS

Various embodiments of the present invention are described and illustrated herein with reference to the drawings in which like items are indicated by the same reference designation, in which.

DETAILED DESCRIPTION

Figure 1:
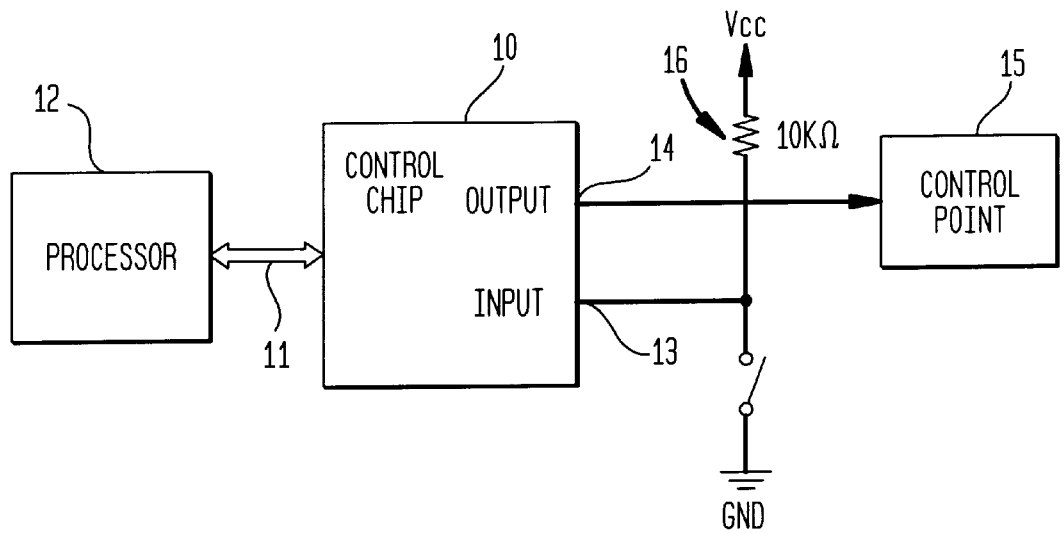
FIG. 1 show a prior art embodiment.
Figure 2:
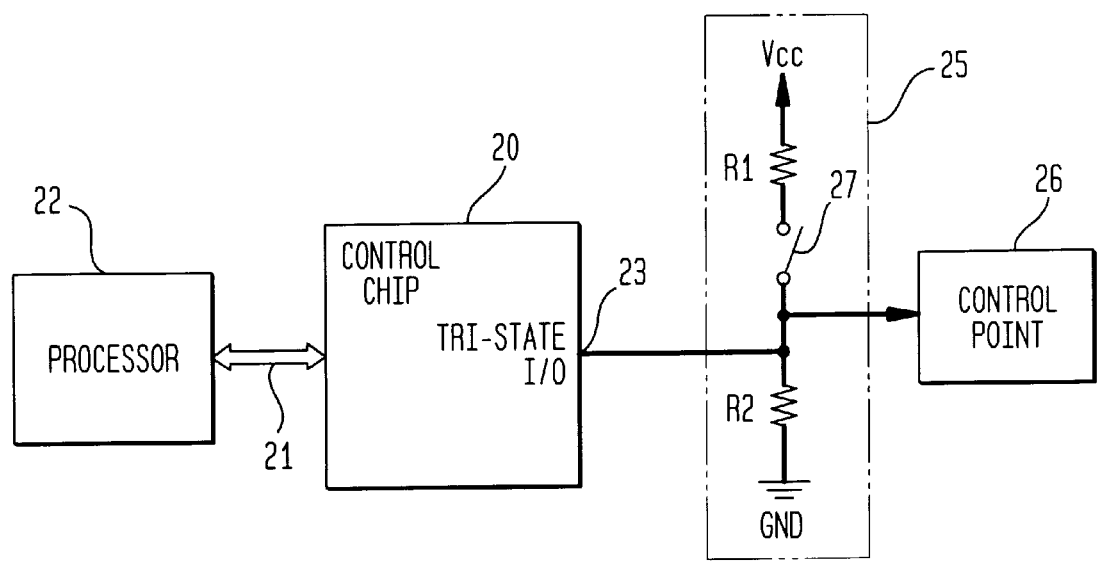
FIG. 2 shows one embodiment of a control chip and switch circuit to control a selectable function of an external circuit as described in accordance with the present invention.

FIG. 1 shows a depiction of a prior art scheme and was explained fully in the Background section of the invention. Turning now to FIG. 2A, this shows one embodiment of an apparatus to control a selectable function of an external circuit in accordance with the present invention. Similar to the traditional technique, there is a control chip 20 coupled to a control/data bus 21 which connects the control chip to a controlling processor 22. The separate input pin and output pin used in the traditional technique, as shown in FIG. 1, have been eliminated and a single input/output pin 23 such as a tri-state pin is implemented instead. Only one pin is used per selectable function of an external circuit.

The tri-state input/output pin is electrically connected to a switch circuit 25. The switch circuit 25 connects to the control point 26 of an external circuit (not shown). The switch circuit 25 has Vcc connected to $R_1$ which is connected to a switch 27. The switch 27 connects to $R_2$ which connects to ground. The input/output pin 23 is connected between the switch and $R_2$. This is also the node that is connected to the control point 26 of the external circuit (not shown). In one illustrative embodiment, Vcc is typically equal to 5 a volts, $R_1$ is equal to 5 k ohm resistor, and $R_2$ is equal to a 10 k ohm resistor.

In such an embodiment, upon power-up, the input/output pin 23 is automatically placed in a high-impedance state, allowing the switch circuit 25 to drive control point 26 and input/output pin 23 with a drive signal having a value selected by the switch 27 setting. As a result, the drive signal either activates or deactivates the selectable function of the external circuit (not shown), depending upon whether the switch 27 sets the switch circuit to a logic high or a logic low. Thus, when the controlling processor 22 comes "on-line", it can interrogate the switch chips 25 to determine the switch setting or the setting of switch 27, by directing control circuit 20 to make input/output pin 23 an input port. Once setting input/output port 23 as an input port, controlling processor can thereby read the switch setting by detecting the voltage or logic state at input/output port 23 of control chip 20.

Moreover, controlling processor 22 can set input/output port 23 as an output port and thereby override the switch 27 setting. That is, input/output port 23 can be configured as an output port so that control circuit 20 can drive switch circuit 25 with enough current to override the logic state set by switch 27. For example, when switch 27 is open, switch circuit 25 and input output pin 23 are thereby set to logic low or ground through resistor R2. In this logic low state, control point 26 receives an Iref equal to the low level input leakage current of control point 26, for example, 10 microamps. To override Iref, processor 22 can direct control chip 20 to drive switch circuit 25 with enough current to override the logic state of switch circuit 25, and thus override the setting of switch 27.

To illustrate, when the switch setting is closed, $$V_{ref} = [(Vcc*R_2)/(R_1+R_2)] - [R_1\|R_2*Iref] =$$

$[R_2*(Vcc-Iref*R_1)]/(R_1+R_2)$, where Iref is equal to the high level input leakage current of control point 26, for example, 10 microamps. Substituting for $R_1$, $R_2$, Vcc and Iref, Vref=3.30 volts. A reference voltage of 3.30 volts is viewed herein as a logic 1 since it is sufficient to drive the input of a typical digital gate available today and will therefore activate control point 26 to select the desired function of the external circuit (not shown). In such an embodiment, controlling processor 22 can direct control chip 20 to drive resistors $R_1$ and $R_2$ with enough current to override the current logic state (i.e. Vref=3.3 volts) and thereby override the setting of switch 27.

As would be understood by a person skilled in the art, the component values included in the description of FIG. 2A are merely exemplary, and a selection of different values for $R_1$ and $R_2$ will result in reference voltages appropriate for many different families of logic gates. In general, the values of $R_1$ and $R_2$ may be selected according to the following criteria: 1) $R_2 << Z_{in}$ of the control point, 2) $R_1\|R_2 >> Z_{out}$ of the control chip and 3) $(Vcc*R_2)/(R_1+R_2)>V_{IH}$ of the control point, where $V_{IH}$ equals the high level input voltage. Moreover, as depicted in FIG. 2A, the switch circuit 25 comprises a combination of resistors and a switch, it would also be understood that the switch circuit may include other functionally equivalent components, such as a combination of transistors and a switch, diodes and a switch or other suitable combinations. A switch circuit with a combination of a switch and transistors T1 and T2 is shown in FIG. 2B. The operation is similar to the switch circuit as shown in FIG. 2A, where like components are labeled in a similar fashion to FIG. 2A.

The present invention also includes a method for providing processor control over an external circuit under control of the switch circuit wherein the switch circuit generates a switch signal input to the control point of the external circuit. It includes the steps of reading the switch signal from the input/output port of a control circuit to determine a present function of the external circuit, determining whether said present function of the external circuit is a desired function and generating a control signal through said input/output port of said control circuit for overriding said switch signal to select said desired function.

Numerous modifications and alternative embodiments of the invention will be apparent to those skilled in the art in view of the foregoing description. For instance, the configuration may be changed to interpose the switch between the control point and $R_2$ rather than the control point and $R_1$, where corresponding changes to the resistor values would be understood by a person skilled in the art. Also, the control chip which includes the control circuit may be a programmable logic device (PLD), a field programmable gate array (FPGA), a gate array, a standard cell, an application specific integrated circuit (ASIC) or other like device. Additionally, the external circuit may include, but would not be limited to a data buffer, a lamp driver, a light emitting diode (LED), an activated relay, a multiplexer, a memory device, a finite state machine, an enabling circuit, a reset circuit, a programmable controller or an actuator. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

What is claimed:

1. A system for providing a control signal to an external circuit, the system comprising:
    a switch circuit coupled to a control point of said external circuit for providing a state of said switch circuit in relation to said control signal; and
    a control circuit operating in response to a processor means, said control circuit having a combined input/output connection coupled to said switch circuit for reading a state of said switch circuit in an input mode, and for transmitting said control signal to said external circuit via said coupled switch circuit in an output mode;
    wherein, for an initial state of said system, said control signal is determined by a state of said switch circuit, and thereafter said control signal is determined as a combination of said switch state and a signal generated by said control circuit as a function of said switch state.

2. A system as in claim 1 wherein said switch circuit comprises a combination of resistors and a switch.

3. A system as in claim 1 wherein said switch circuit comprises a combination of transistors and a switch.

4. A system as in claim 1 wherein said switch circuit comprises a combination of diodes and a switch.

5. A system as in claim 1 wherein said switch circuit has a first resistor connected between a given first voltage and said control point, and a second resistor connected between said control point and a second given voltage.

6. A system as in claim 5 wherein said first voltage is a supply voltage for powering digital logic and said second voltage is zero volts.

7. A system as in claim 5 wherein component values for said first and second resistor are selected according to the criteria: $R_2 \ll Z_{in}$ of the control point, $R_1 \| R_2 \gg Z_{out}$ of the control circuit and $(Vcc*R_2)/(R_1+R_2) > V_{IH}$ of the control point, where $V_{IH}$ equals the high level input voltage.

8. A system as in claim 1 wherein said input/output connection of said control circuit is a tri-state port.

9. A system as in claim 1 wherein said switch circuit state has an initial value determined upon power-up of the system.

10. A system as in claim 1 wherein said control circuit is located in a control chip.

11. A system as in claim 10 wherein the control chip is an integrated circuit selected from the group consisting of a programmable logic device (PLD), a field programmable gate array (FPGA), a gate array, a standard cell and an application specific integrated circuit (ASIC).

12. A system as in claim 11 wherein the control chip is electrically coupled to a controlling processor.

13. A system as in claim 11 wherein said a processor means controls the operation of said integrated circuit.

14. A system as in claim 1 wherein the external circuit is selected from the group consisting of a data buffer, a lamp driver, a light emitting diode (LED), an activated relay, a multiplexer, a memory device, a finite state machine, an enabling circuit, a reset circuit, a programmable controller and an actuator.

15. An integrated circuit for providing processor control over a control signal for an external circuit, said control signal being determined in relation to a state of a switch circuit, wherein an initial state of said control signal is determined by the state of said switch circuit, the integrated circuit comprising a control circuit having a combined input/output port coupled to the switch circuit, said control circuit operable under processor control to read a state of said switch circuit in an input mode and generate said control signal through said input/output port in an output mode, wherein said control signal overrides said switch circuit state to provide a signal operative to select a function of the external circuit.

16. An integrated circuit as in claim 15 wherein said switch circuit includes components selected from the group consisting of resistors, transistors and diodes in combination with a switch.

17. An integrated circuit as in claim 15 wherein said switch circuit has a first resistor connected between a given first voltage and a control point, and a second resistor connected between said control point and a second given voltage.

18. An integrated circuit as in claim 17 wherein said first voltage is a supply voltage for powering digital logic and said second voltage is zero volts.

19. An integrated circuit as in claim 15 wherein said input/output port of said control circuit is tri-state.

20. An integrated circuit as in claim 15 wherein said switch signal has an initial value determined upon power-up of the system.

21. An integrated circuit as in claim 15 wherein said control circuit is located in a control chip and the control chip is an integrated circuit selected from the group consisting of a programmable logic device (PLD), a field programmable gate array (FPGA), a gate array, a standard cell and an application specific integrated circuit (ASIC).

22. An integrated circuit as in claim 15 wherein said control circuit is electrically coupled to a controlling processor.

23. An integrated circuit as in claim 15 further comprising a processor for controlling the operation of said integrated circuit.

24. An integrated circuit as in claim 15 wherein the external circuit is selected from the group consisting of a data buffer, a lamp driver, a light emitting diode (LED), an activated relay, a multiplexer, a memory device, a finite state machine, an enabling circuit, a reset circuit, a programmable controller and an actuator.

25. An integrated circuit as in claim 17 wherein component values for said first and second resistor are selected according to the criteria: $R_2 \ll Z_{in}$ of the control point, $R_1 \| R_2 \gg Z_{out}$ of the control circuit and $(Vcc*R_2)/(R_1+R_2) > V_{IH}$ of the control point, where $V_{IH}$ equals the high level input voltage.

26. A method for providing a control signal directed to a controlled instrumentality, wherein said control signal is a function of a cooperative combination of a switch circuit and a processor-controlled control circuit and is initially determined in relation to a state of said switch circuit, the method comprising the steps of:

reading a state of said switch circuit through a combined input/output port of said control circuit;

determining whether said read state of said switch circuit is a desired state;

generating said control signal to override said switch state if said read state is not the desired state; and inputting the control signal to a control point of said controlled instrumentality to select a desired function thereof.

27. A system to control selectable functions of at least one external circuit, the system comprising:

at least one switch circuit, each switch circuit coupled to a control point of said external circuit for providing a state of said switch circuit to said control point; and a control circuit having a combined input/output connection coupled to each switch circuit for reading a state of said switch circuit in an input mode and for transmitting a control signal to said external circuit via said coupled switch circuit in an output mode;

wherein, for an initial state of said system, said control signal is determined by a state of said switch circuit, and thereafter said control signal is determined as a combination of said switch state and a signal generated by said control circuit as a function of said switch state.

* * * * *